United States Patent
Okajima et al.

(10) Patent No.: US 7,274,006 B2
(45) Date of Patent: Sep. 25, 2007

(54) HEATER

(75) Inventors: Hisakazu Okajima, Nishikasugai-Gun (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/498,378

(22) Filed: Aug. 3, 2006

(65) Prior Publication Data
US 2007/0039944 A1 Feb. 22, 2007

(30) Foreign Application Priority Data
Aug. 16, 2005 (JP) ............................. 2005-236154

(51) Int. Cl.
*H05B 3/68* (2006.01)
*C23C 16/00* (2006.01)

(52) U.S. Cl. .................. 219/465.1; 219/390; 219/405; 219/411; 392/416; 392/418; 118/724; 118/725; 118/50.1; 118/728; 118/729

(58) Field of Classification Search ................ 219/390, 219/405, 411, 465.1; 392/416, 418; 118/724, 118/725, 80.1, 728–29
See application file for complete search history.

(56) References Cited

U.S. PATENT DOCUMENTS

| | | | |
|---|---|---|---|
| 6,223,447 B1 | 5/2001 | Yudovsky et al. | |
| 6,494,955 B1 | 12/2002 | Lei et al. | |
| 7,072,579 B2 * | 7/2006 | Kusuda | ...................... 392/416 |

FOREIGN PATENT DOCUMENTS

JP 2002-093894 A1 3/2002

* cited by examiner

*Primary Examiner*—Shawntina Fuqua
(74) *Attorney, Agent, or Firm*—Burr & Brown

(57) ABSTRACT

A heater includes a heating member formed in a plate shape that includes a substrate-heating surface on which a substrate is mounted and a heating member rear surface which is on the opposite side of the substrate-heating surfaces. The heater also has a resistance heating element embedded therein. An auxiliary member is placed on the side of the heating member rear surface of the heating member and has an opposing surface which opposes the heating member rear surface. A planar gas path for gas ejected on the substrate-heating surface is formed between the heating member rear surface and the opposing surface.

9 Claims, 11 Drawing Sheets

HEATER

CROSS REFERENCE TO RELATED APPLICATIONS

This application is based upon and claims the benefit of priority from prior Japanese Patent Application P2005-236154 filed on Aug. 16, 2005; the entire contents of which are incorporated by reference herein.

BACKGROUND OF THE INVENTION

1. Field of the Invention

The present invention relates to a heater.

2. Description of the Related Art

Heaters have been conventionally utilized to heat substrates in semiconductor manufacturing processes and liquid crystal manufacturing processes. Examples of such heaters include Physical Vapor Deposition (PVD) devices, Chemical Vapor Deposition (CVD) devices, and dry etching devices that usually utilize corrosive gases. Ceramics are generally utilized for substrates of the heaters in terms of corrosion resistance.

In semiconductor manufacturing processes and liquid crystal manufacturing processes, a substrate is mounted on a substrate-heating surface provided a substrate-heating member of the heater. Reactive films can be accumulated on an outer circumferential portion of the substrate. While the substrate is not adhered to the substrate-heating surface, the reactive film can be adhered to the substrate-heating surface. When the substrate is removed from the substrate-heating surface, the reactive film is hardly removed from the substrate-heating surface. By a stress generated between the reactive film and the substrate-heating surface, the reactive film can be chipped or cracked. Further, the substrate can be also chipped or cracked.

Consequently, in an attempt to prevent the reactive film from accumulating at the outer circumferential portion of the substrate, as disclosed in Japanese Patent Application Laid-open No. 2002-93894, a plurality of gas ejection ports from which gas ejects are provided on the substrate-heating surface.

While accumulation of the reactive film is reduced by increasing the amount of gas ejected from the gas ejection ports, generation of growing films on the substrate is affected. Accordingly, the amount of ejected gas cannot be increased easily. Preferably, the amount of gas ejected from each of the gas ejection ports is such an amount that reduces accumulation of the reactive film and does not affect generation of the growing film.

According to the prior techniques, however, since a plurality of gas paths are formed by drilling sintered ceramic heater, a part of ceramic is broken during cutting. It is difficult to improve the dimensional accuracy of the gas paths. The amount of gas ejected on the substrate-heating surface is varied.

An object of the present invention is to provide a heater that can reduce variations in an amount of gas ejected on a substrate-heating surface and suppress accumulation of a reactive film on the substrate-heating surface without affecting generation of a growing film on a substrate.

SUMMARY OF THE INVENTION

A heater according to the present invention comprises a heating member formed in a plate shape that includes a substrate-heating surface on which a substrate is mounted and a heating member rear surface which is on the opposite side of the substrate-heating surface, and has a resistance heating element embedded therein; and an auxiliary member that is placed on the side of the heating member rear surface of the heating member and has an opposing surface which opposes the heating member rear surface, wherein a planar gas path that is a path for gas ejected on the substrate-heating surface is formed between the heating member rear surface and the opposing surface.

According to such a heater, the heating member is provided with the heating member rear surface, and the auxiliary member is provided with the opposing surface. The planar gas path is formed between the heating member rear surface and the opposing surface.

Because the heating member rear surface and the opposing surface have simple planar shapes, they are easily formed by molding with metallic molds and sintering.

Compared to a conventional case of forming a gas path by drilling, the dimensional accuracy of the planar gas path formed between the heating member rear surface and the opposing surface is improved.

Variations in an amount of gas ejected on the substrate-heating surface are reduced, and accumulation of the reactive film on the substrate-heating surface is suppressed without affecting generation of growing films on a substrate.

Preferably, the opposing surface extends outward beyond the heating member rear surface, and an opposing wall which is placed in continuity along the side surface of the heating member on the opposing surface and protrudes in a direction substantially perpendicular to the opposing surface.

According to such configuration, the gas ejection path which communicates from the planar gas path toward the substrate-heating surface is formed between the side surface of the heating member and the opposing wall provided along the side surface of the heating member. An ejection port from which gas ejects along the entire outer circumference of the substrate-heating surface is formed.

Compared to a case of providing a plurality of ejection ports at the outer circumferential portion of the substrate-heating surface, accumulation of the reactive film on the substrate-heating surface is suppressed effectively.

Preferably, there are provided a first supporting member that supports the heating member from the heating member rear surface and a second supporting member that supports the auxiliary member from an auxiliary member rear surface which is a surface of the auxiliary member on the opposite side of the opposing surface.

Preferably, the opposing wall of the auxiliary member comprises a surface that is lower than the substrate-heating surface.

According to such configuration, the opposing wall of the auxiliary member and the heating member allow peripheral members such as rings to be fitted on the surface lower than the substrate-heating surface at the outer circumference of the substrate-heating surface.

Preferably, the heating member comprises a plurality of communicating holes that communicate from the substrate-heating surface to the planar gas path, and the plurality of communicating holes are formed along an outer circumferential portion of the substrate-heating surface at regular intervals therebetween.

According to this configuration, the heating member includes the plurality of communicating holes that communicate from the substrate-heating surface to the planar gas path. In a manufacturing process of the heater, the heating member is easily positioned with respect to the auxiliary member. Further, since the communicating holes are formed along the outer circumferential portion of the substrate-heating surface at regular intervals, accumulation of the reactive film on the substrate-heating surface is suppressed effectively.

Preferably, there are provided a first supporting member that supports the heating member from the heating member rear surface and a second supporting member that supports the auxiliary member from the auxiliary member rear surface which is a surface of the auxiliary member on the opposite side of the opposing surface. A clearance which communicates from a portion that the planar gas path meets the communicating hole to the outside of the heater is formed between the heating member rear surface and the opposing surface, and the clearance is configured to control a gas flow.

According to this configuration, the clearance formed between the heating member rear surface of the heating member and the opposing surface of the auxiliary member communicates from the portion that the planar gas path meets the communicating hole to the outside of the heater. That is, the heating member rear surface does not contact the opposing surface of the auxiliary member.

Therefore, the clearance formed between the heating member rear surface and the opposing surface of the auxiliary member absorbs dimensional errors in the first supporting member and the second supporting member.

Since the clearance formed between the heating member rear surface of the heating member and the opposing surface of the auxiliary member is configured to control a gas flow, leakage of gas ejected toward the substrate-heating surface from the clearance is suppressed.

Examples of the configuration for controlling a gas flow include a configuration whose cross-sectional area is significantly smaller than that of the planar gas path and a crank configuration.

Preferably, there is provided a first supporting member which supports the heating member from the heating member rear surface. On the opposing surface, there are provided an outer circumferential wall which is placed in continuity outside the communicating hole and an inner circumferential wall which is placed in continuity inside the communicating hole. The length of the outer circumferential wall is substantially equal to that of the inner circumferential wall in a direction substantially perpendicular to the opposing surface. The auxiliary member is fixed to the heating member.

According to this configuration, the auxiliary member is fixed to the heating member, and the height of the outer circumferential wall is substantially equal to that of the inner circumferential wall. As a result, the dimensional accuracy of the planar gas path formed between the heating member rear surface of the heating member and the opposing surface of the auxiliary member is improved. Gas leakage from the planar gas path is suppressed.

Because members for supporting the auxiliary member are not required, the device is lightened and easily handled. Since the diameter of a base is made to be small, a part to which the device is mounted via the base is designed to be compact.

The auxiliary member is preferably fixed to the heating member by brazing or screwing.

Accordingly, the auxiliary member is easily fixed to the heating member. When the auxiliary member is fixed to the heating member by screwing, the distance from the auxiliary member to the heating member is changed easily. Therefore, the amount of gas flow in the planar gas path is adjusted easily.

Preferably, the communicating hole extends in a direction substantially perpendicular to the substrate-heating surface.

Since gas from the communicating hole ejects in a direction substantially perpendicular to the substrate-heating surface, accumulation of the reactive film is further reduced.

Preferably, the heating member comprises a surface which is lower than the substrate-heating surface on the outside of the substrate-heating surface.

According to this configuration, the opposing wall of the auxiliary member and the heating member allow peripheral members such as rings to be mounted on the surface lower than the substrate-heating surface at the outer circumference of the substrate-heating surface.

DETAILED DESCRIPTION OF THE INVENTION

Figure 1:
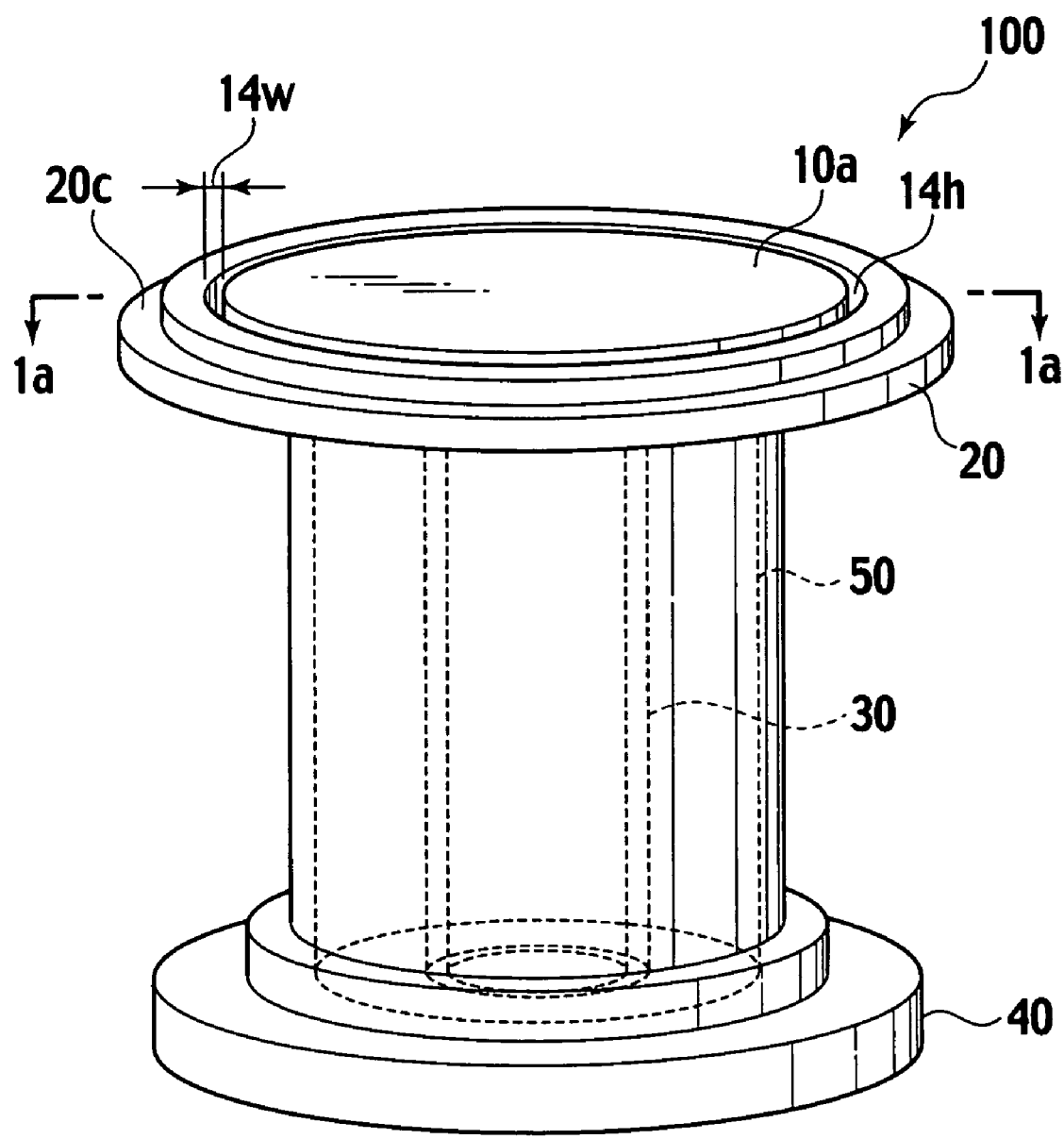
FIG. 1 is a perspective view of a heater according to a first embodiment of the present invention.

Preferred embodiments of the present invention will be explained below in detail with reference to the accompanying drawings. Like or similar reference numerals are used throughout the drawings to indicate like or similar parts. Note that the drawings are only illustrative, and proportions of dimensions may be different from actual ones.

Accordingly, specific dimensions should be determined by considering the following descriptions. It is thus obvious that the accompanying drawings include various parts with different dimensional relationships or different proportions.

FIRST EMBODIMENT

Heater

A heater 100 according to a first embodiment of the present invention will be described hereinafter with reference to the drawings. FIG. 1 is a perspective view of the entire heater 100 according to the first embodiment. The heater 100 has a heating member 10 which is supported by a first supporting member 30 and includes a substrate-heating surface 10a, an auxiliary member 20 supported by a second supporting member 50, an ejection port 14h from which gas ejects, and a base 40 which supports the first supporting member 30 and the second supporting member 50. The heater 100 heats substrates mounted on the substrate-heating surface 10a.

The heating member 10 has the substrate-heating surface 10a, a heating member rear surface 10b, and a side surface 10c. A substrate such as a silicon substrate or a glass substrate is mounted on the substrate-heating surface 10a. The surface roughness (Ra) of the substrate-heating surface 10a is preferably 0.1 to 6.3 micrometers.

The heating member 10 heats the substrate-heating surface 10a by electricity applied from a feeding member 12 described later to a resistance heating element 11 so as to heat the substrate mounted on the substrate-heating surface 10a. Plates including a disk shaped one can be utilized for the heating member 10. The heating member 10 is made of ceramics or composite materials of ceramics and metals. For example, the heating member 10 can be made of a sintered body of aluminum nitride (AlN), alumina ($Al_2O_3$), silicon nitride (SiN), silicon carbide (SiC), or sialon (SiAlON), or made of aluminum (Al), aluminum alloy, aluminum alloy-aluminum nitride composite, or aluminum alloy-SiC composite. The heating member 10 can contain yttrium oxide as a sintering aid. The total amount of components other than materials for the aforementioned main component for making the heating member 10 is preferably equal to or less than 5. The heating member 10 is supported by the first supporting member 30.

The first supporting member 30 is a hollow cylinder and houses the feeding member 12 therein. The first supporting member 30 is joined to the heating member rear surface 10b of the heating member 10. The first supporting member 30 is made of aluminum nitride, silicon nitride, or aluminum oxide. The first supporting member 30 is preferably made of the same type of materials as those of the heating member 10.

The auxiliary member 20 has an opposing surface 20a with which an opposing wall 21 described later is provided and an auxiliary member rear surface 20d. The auxiliary member 20 is preferably made of the same ceramics or the same composite materials of ceramics and metals as those of the heating member 10.

The opposing wall 21 is provided outside the heating member 10 above the opposing surface 20a, and formed in continuity along the side surface 10c of the heating member 10. The opposing wall 21 has an opposing wall side surface 20b and a mounted surface 20c. The opposing wall 21 opposes the side surface 10c of the heating member 10. The mounted surface 20c is lower than the substrate-heating surface 10a of the heating member 10. The auxiliary member 20 is supported by the second supporting member 50.

The second supporting member 50 is, as the first supporting member 30, made of aluminum nitride, silicon nitride, or aluminum oxide. The second supporting member 50 is preferably made of the same type of materials as those of the auxiliary member 20.

The auxiliary member 20 is joined to the second supporting member 50 integrally or by sealing. For sealing, O-rings and metallic packings are utilized. Alternatively, a unit of the auxiliary member 20 and the second supporting member 50 can be integrally formed.

The second supporting member 50 and the first supporting member 30 are supported by the base 40. The second supporting member 50 and the first supporting member 30 are fixed to the base 40 by screws. Joined portions to the base 40 are formed in a seal configuration by O-rings. The base 40 is made of, for example, aluminum, SUS, or Ni.

A gas path 14 is formed between the heating member 10 and the auxiliary member 20.

Specifically, the gas path 14 is formed by a planar gas path 14a and a gas ejection path 14b which is in communication with the planar gas path 14a.

The planar gas path 14a is formed between the heating member rear surface 10b of the heating member 10 and the opposing surface 20a of the auxiliary member 20.

The gas ejection path 14b is formed between the side surface 10c of the heating member 10 and the opposing wall 21. The gas ejection path 14b communicates from the planar gas path 14a toward the substrate-heating surface 10a. By the gas path 14, the ejection port 14h from which gas ejects is formed along the entire outer circumference of the substrate-heating surface 10a. A path width 14w which is the width of the gas path 14 is a distance from the side surface 10c of the heating member 10 to the opposing wall 21.

The aforementioned gas path 14 is further described below.

Figure 2:
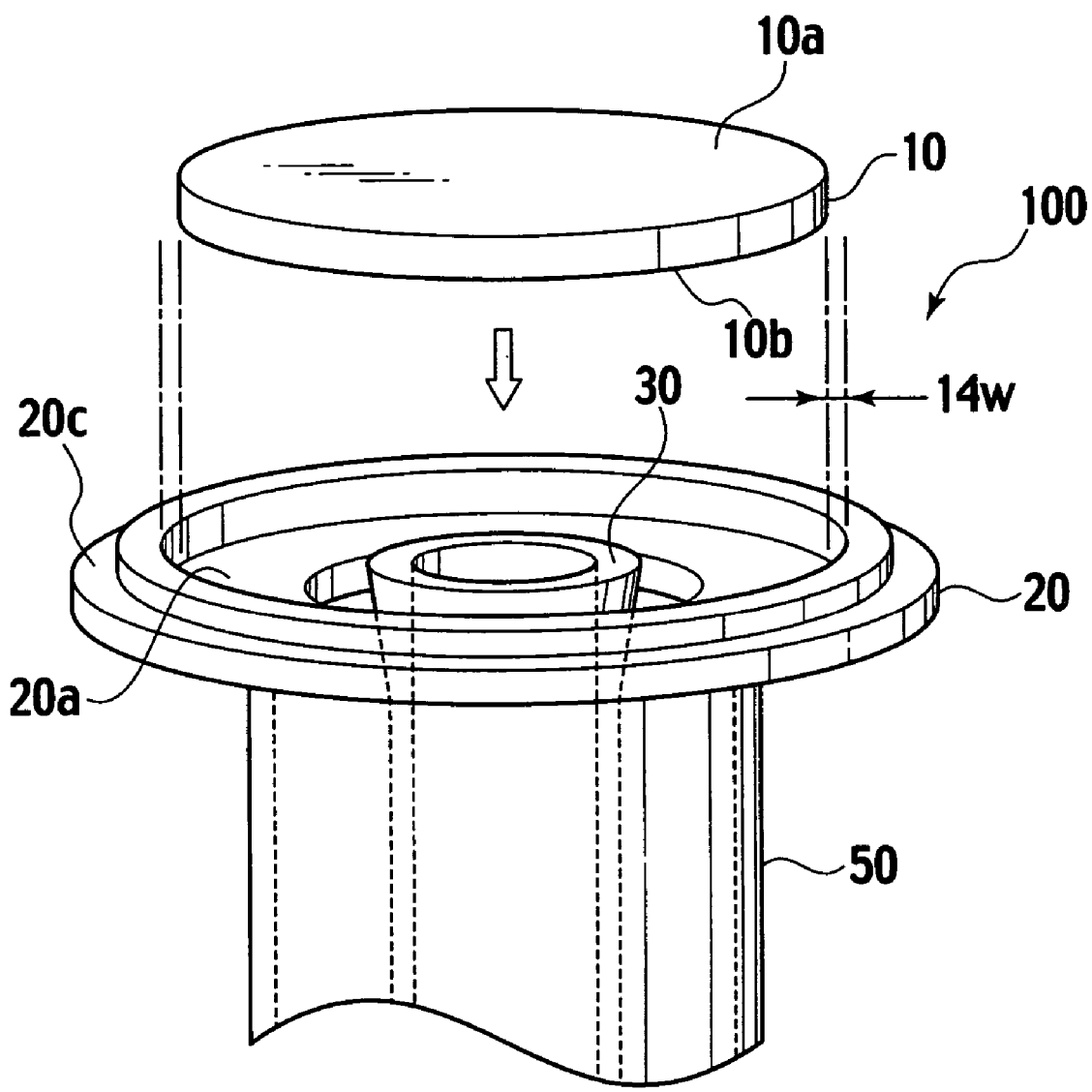
FIG. 2 is an exploded view of the heater according to the first embodiment.

FIG. 2 shows a part of the exploded view of FIG. 1.

As shown in FIG. 2, the auxiliary member 20 is provided with a hole thorough which the first supporting member 30 passes and supported by the second supporting member 50. The heating member 10 is supported by the first supporting member 30. A connected surface of the first supporting member 30 and the heating member 10 is positioned higher than the opposing surface 20a of the auxiliary member 20, so that the planar gas path 14a is formed.

The opposing surface 20a of the auxiliary member 20 opposes the heating member rear surface 10b of the heating member 10. The opposing surface 20a extends outward beyond the heating member rear surface 10b.

The opposing wall 21 is formed in continuity along the outer circumference of the opposing surface 20a. Thus, the gas ejection path 14b is formed between the side surface 10c of the heating member 10 and the opposing wall 21.

Figure 3:
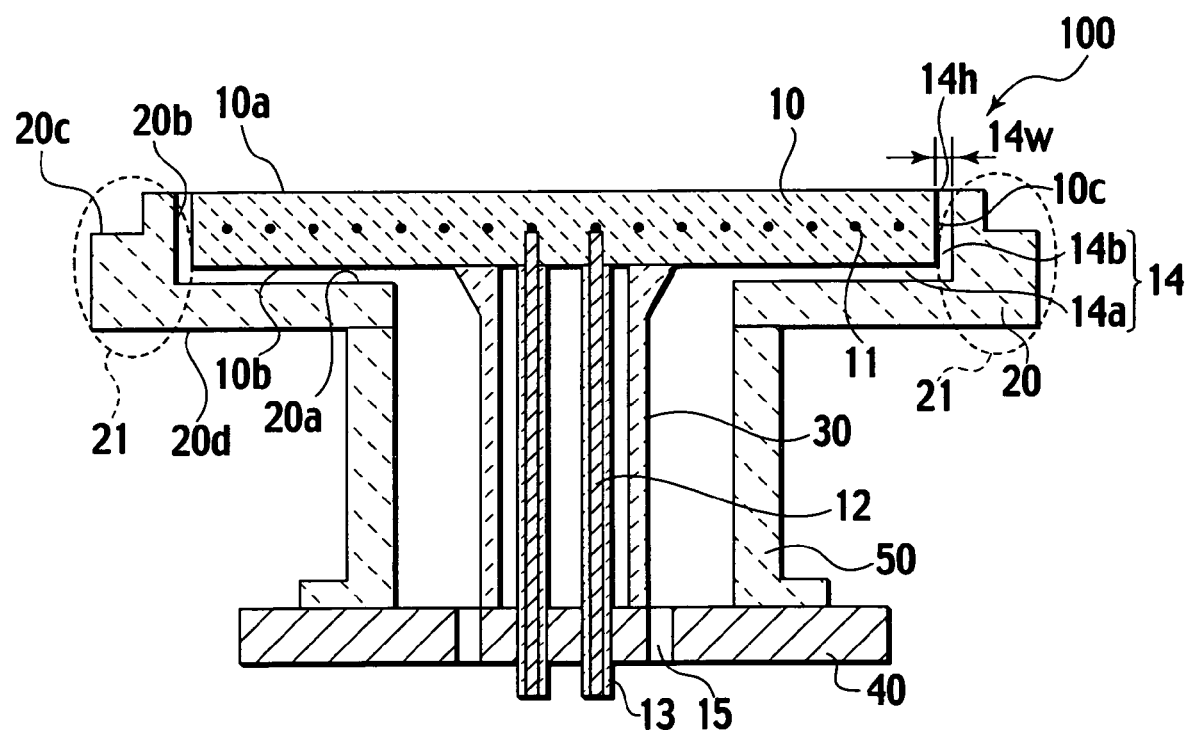
FIG. 3 is a cross-sectional view of the heater of the first embodiment, taken along a line 1a-1a in FIG. 1.

FIG. 3 is a cross-sectional view taken along a line 1a-1a in FIG. 1. As shown in FIG. 3, the width of the planar gas path 14a, i.e., the distance from the opposing surface 20a to the heating member rear surface 10b is determined by lengths of the first supporting member 30 and the second supporting member 50 from the base 40. The heating member 10 has resistance heating elements 11 embedded therein and holes for the feeding member 12 inserted.

The resistance-heating element 11 is embedded into the heating member 10. Niobium, molybdenum, or tungsten can be used for the resistance-heating element 11. The resistance heating element 11 formed in a linear shape, a coil shape, a band shape, a mesh shape, or a film shape can be used.

The first supporting member 30 is a hollow cylinder and houses the feeding member 12 therein.

The feeding member 12 supplies electricity to the resistance-heating element 11. The feeding member 12 is connected to the resistance-heating element 11. The feeding member 12 is made of Ni, Al, Cu, or alloy. The feeding member 12 is formed in a rod, a circular column, a cable, a plate, a corded fabric, or a cylinder. The feeding member 12 is connected to the resistance-heating element 11 by brazing, welding, eutectic, caulking, fitting, or screwing. The feeding member 12 is coated with an insulating member 13. The insulating member 13 is made of, for example, ceramics to present insulation properties and heat insulation properties.

The base 40 has a gas introduction hole 15. A path for gas which is supplied from the gas introduction hole 15, passes through the space between the second supporting member 50 and the first supporting member 30 and the gas path 14, and reaches the substrate-heating surface 10a is formed.

Preferably, a known gas, for example, nitrogen, helium, argon, or mixed gas of helium and argon is flown at a rate of 0.5 to 20 L/min in terms of 1 atm and 0° C. According to the heater 100, the heating member 10 is provided with the heating member rear surface 10b, the auxiliary member 20 is provided with the opposing surface 20a, and the planar gas path 14a is formed between the heating member rear surface 10b and the opposing surface 20a.

According to the heater 100 of the first embodiment, because the heating member rear surface 10b and the opposing surface 20a are formed in a simple planar shape, they are formed easily by molding with metallic molds and sintering.

Compared to a conventional case that the gas path 14 is formed by drilling, the dimensional accuracy of the planar gas path 14a formed between the heating member rear surface 10b and the opposing surface 20a is improved.

Variations in the amount of gas ejected on the substrate-heating surface 10a are reduced. Accumulation of reactive films on the substrate-heating surface 10a is suppressed without affecting generation of growing films on a substrate.

The ejection port 14h from which gas ejects is formed along the entire outer circumference of the substrate-heating surface 10a. Comparing to a case that a plurality of ejection ports are provided at the outer circumferential portion of the substrate-heating surface 10a, accumulation of the reactive film on the substrate-heating surface is effectively suppressed.

The opposing wall 21 of the auxiliary member 20 has the mounted surface 20c which is lower than the substrate-heating surface 10a at the outer circumference thereof. Peripheral members such as rings are thus mounted at the outer circumference of the substrate-heating surface 10a.

The auxiliary member 20 is made of the same ceramics or the same composite materials of ceramics and metals as those of the heating member 10. Accordingly, at the time of processing the heater 100 at high temperatures, heat shrinkable behaviors of the heating member 10 are the same as those of the auxiliary member 20.

The surface roughness (Ra) of the substrate-heating surface 10a is 0.01 to 6.3 micrometers. A substrate is made to contact properly the substrate-heating surface 10a, so that the temperature of the substrate is maintained so as to be constant.

The first supporting member 30 is made of the same type of materials as those of the heating member 10. It is possible to prevent generation of a thermal stress due to the difference between thermal expansion coefficients at the joined portion of the heating member 10 and the first supporting member 30. The first supporting member 30 is thus joined firmly.

The second supporting member 50 is made of the same type of materials as those of the auxiliary member 20. It is possible to prevent generation of a thermal stress due to the difference between thermal expansion coefficients at the joined portion of the auxiliary member 20 and the second supporting member 50. The second supporting member 50 is thus joined firmly.

(Manufacturing Method of Heater)

The heater 100 is manufactured by a step of forming the heating member 10 with the resistance heating elements 11, a step of forming the auxiliary member 20, and a step of forming the gas path 14 between the heating member rear surface 10b of the heating member 10 and the opposing surface 20a of the auxiliary member 20.

The heating member 10 is manufactured first as follows. A binder, optionally an organic solvent and a dispersant are added to ceramics raw powder for the heating member 10 and they are mixed together, so that a slurry is prepared. The ceramics raw powder contains ceramics powder serving as the main component, a sintering aid, and a binder. For example, aluminum nitride powder is used as the main component, and yttrium oxide powder is added thereto as the sintering aid. The total amount of components other than materials for the main component is preferably equal to or less than 5%. The ceramics raw powder is mixed by a ball mill.

The resulting slurry is granulated by spray granulation, so that granule is obtained. The resulting granule is molded by various molding methods including metallic molding, CIP (Cold Isostatic Pressing), and slip casting.

The resistance heating elements 11 are formed on the molded body. For example, a printing paste which contains powder of high-melting point materials is prepared and printed on the molded body in a predetermined pattern by screen printing, so that the resistance heating elements 11 are formed. The ceramics raw material powder for the heating member 10 is preferably mixed with the printing paste. Accordingly, the thermal expansion coefficient of the resistance-heating element 11 is made to approximate that of the heating member 10, resulting in improved adhesion.

On the molded body with the resistance heating elements 11 formed thereon, a molded body obtained by the similar manner is laminated and the molded bodies are integrally sintered. For example, the molded body with the resistance heating elements 11 formed thereon is placed in a metallic mold. Granule prepared by the same manner as that of the molded body is loaded on the resistance heating elements 11 and the molded body, so that molding and laminating are accomplished simultaneously.

The molded body with the resistance heating elements 11 embedded therein is integrally sintered by various sintering methods including hot pressing and pressureless sintering. As a result, the heating member 10 serving as an integrally sintered body is prepared. For example, the resulting molded body can be sintered using appropriate atmospheres, sintering temperatures, sintering times, and sintering methods according to types of ceramics. For example, if aluminum nitride powder is used as the ceramic raw material powder, the molded body is sintered by hot pressing under an inert gas atmosphere such as nitrogen gas or argon gas at 1700° C. to 2200° C. for about 1 to 10 hours. The pressure to be applied during sintering is 20 to 1000 kgf/cm$^2$. As a result, adhesion between the heating member 10 and the resistance-heating element 11 is improved. The sintering temperature is preferably 1750° C. to 2050° C. and the pressure is preferably 50 to 200 kgf/cm$^2$.

Finally, for the resulting heating member 10, a flattening process of the substrate-heating surface 10a and a process of drilling a hole to connect the feeding member 12 to the resistance-heating element 11 are performed. Apart of the resistance-heating element 11 is exposed in advance.

The auxiliary member 20 is prepared by the same manner as that of the heating member 10. A molded body is prepared to have a hole through which the first supporting member 30 passes, the opposing wall 21 which is placed outside the heating member 10, and the opposing surface 20a which extends outward beyond the heating member rear surface 10b of the heating member 10. The mounted surface 20c which is lower than the substrate-heating surface 10a of the heating member 10 is preferably formed at the outer circumferential portion of the opposing wall 21. The mounted surface 20c is formed by grinding after sintered, as well as molded with a metallic mold.

While the heating member 10 and the auxiliary member 20 are prepared, the first supporting member 30 and the second supporting member 50 are also prepared. The first supporting member 30 is formed by, as in the case of preparing the heating member 10, preparing granule, preparing a tube-shaped molded body, and pressureless sintering the resulting sintered body, for example, in nitrogen gas. The first supporting member 30 is preferably prepared by using the same raw material powder as the ceramics raw material powder used for preparing the heating member 10.

The second supporting member 50 is formed by, as in the case of preparing the auxiliary member 20, preparing granule, preparing a tube-shaped molded body by isostatic pressing, and pressureless sintering the resulting molded body, for example, in nitrogen gas. The second supporting member 50 is preferably prepared by using the same raw material powder as the ceramics raw material powder used for preparing the auxiliary member 20.

The heating member rear surface 10b of the heating member 10 is joined to the first supporting member 30 by, for example, caulking, welding, brazing, or soldering. Specifically, cementing materials according to the materials for the heating member 10 and the first supporting member 30 are applied to at least one of the joined surfaces of the heating member 10 and the first supporting member 30. The joined surface of the heating member 10 is adhered to the joined surface of the first supporting member 30. They are joined together by subjected to a thermal processing under atmospheres and temperatures according to the materials for the heating member 10 and the first supporting member 30. The heating member 10 and the first supporting member 30 can be pressurized in a direction perpendicular to the joined surface.

If the heating member 10 and the first supporting member 30 are aluminum nitride sintered bodies, a rare earth compound is applied as the cementing material. The heating member 10 and the first supporting member 30 are then joined together by held under an inert gas atmosphere such as nitrogen or argon at 1500° C. to 2000° C. for 1 to 10 hours.

The auxiliary member 20 is joined to the second supporting member 50 by the same manner as in the case of joining the heating member rear surface 10b to the first supporting member 30.

The first supporting member 30 and the second supporting member 50 are fixed to the base 40 by screws. They are fixed so that the gas path 14 is formed between the auxiliary member 20 and the heating member 10. The respective joined surfaces to the base 40 are formed in a seal configuration by O-rings. A through hole for the feeding member 12 and the gas introduction hole 15 for allowing a gas flow in the gas path 14 are formed at the base 40 in advance by drilling.

According to the manufacturing method of the heater 100 of the first embodiment, there are provided the step of forming the heating member 10 with the resistance heating elements 11 and the step of forming the auxiliary member 20. The heating member 10 and the auxiliary member 20 are formed separately. The heating member 10 and the auxiliary member 20 are easily formed because they are consisted of simple surfaces and formed by metallic molds.

The manufacturing method further comprises the step of forming the gas path 14 between the heating member rear surface 10b of the heating member 10 and the opposing surface 20a of the auxiliary member 20. Compared to the conventional case of forming the gas path 14 by drilling, the dimensional accuracy of the planar gas path 14a formed between the heating member rear surface 10b and the opposing surface 20a is improved.

Namely, the heater 100 that reduces variations in the amount of gas ejected on the substrate-heating surface 10a and suppresses accumulation of the reactive film on the substrate-heating surface 10a without affecting generation of the growing film on the substrate is manufactured.

SECOND EMBODIMENT

Heater

A heater 100 according to a second embodiment of the present invention will be described below with reference to the drawings. The differences between the first embodiment and the second embodiment will be described mainly.

Specifically, in the first embodiment, the auxiliary member 20 that has the opposing surface 20a which extends outward beyond the heating member rear surface 10b of the heating member 10 is utilized. By forming the opposing wall 21 which is placed in continuity along the side surface 10c of the heating member 10 and protrudes in a direction substantially perpendicular to the opposing surface 20a, the gas ejection path 14b which communicates from the planar gas path 14a to the substrate-heating surface 10a is formed between the side surface 10c and the opposing wall 21.

In contrast, according to the second embodiment, the heating member 10 is provided with a communicating hole 14c which communicates from the planar gas path 14a to the substrate-heating surface 10a.

Figure 4:
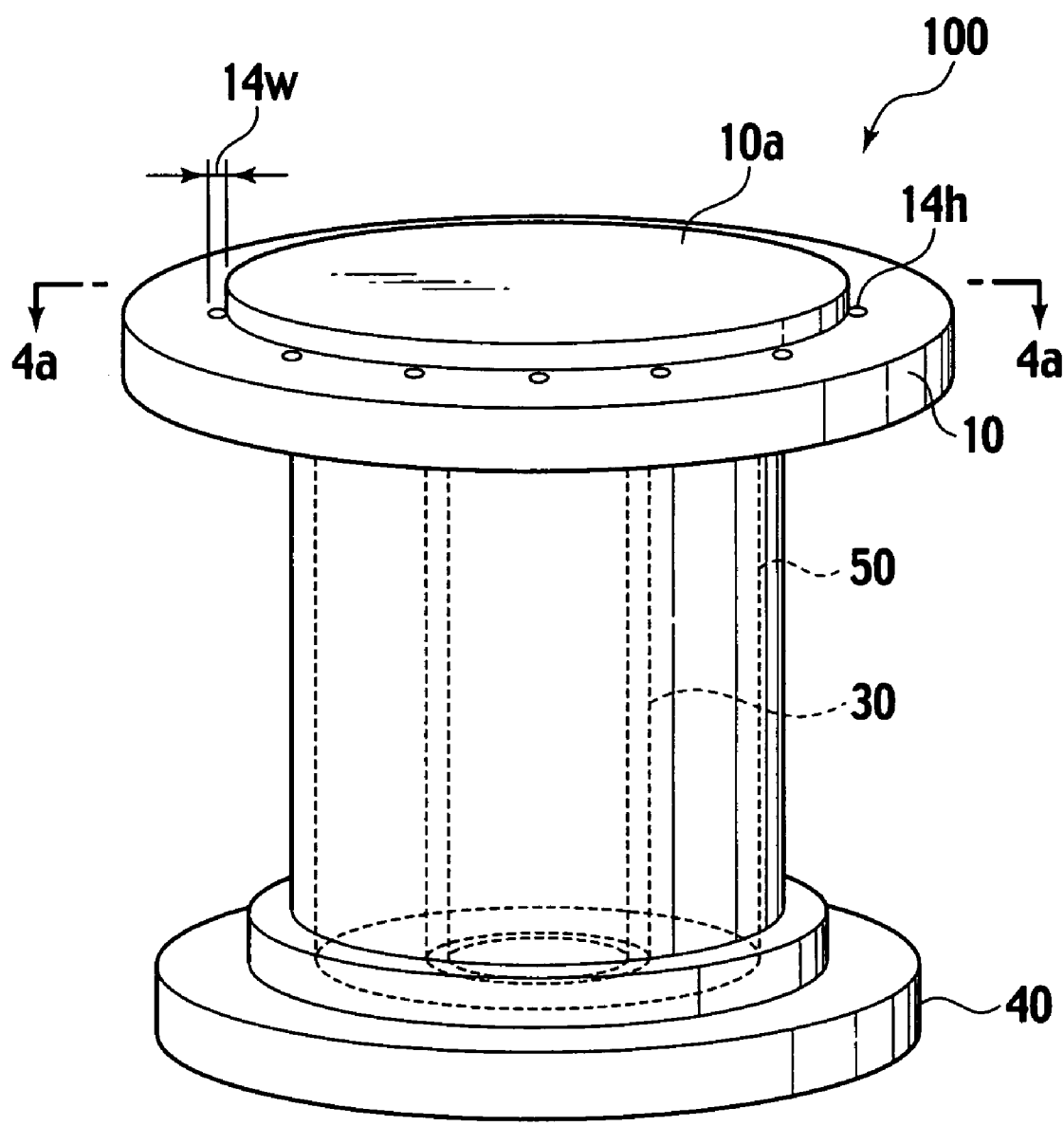
FIG. 4 a perspective view of a heater according to a second embodiment of the present invention.

FIG. 4 is a perspective view of the entire heater 100 according to the second embodiment. Because the resistance heating element 11, the feeding member 12, the insulating member 13, the first supporting member 30, the base 40, and the second supporting member 50 are the same as in the first embodiment, descriptions thereof will be omitted. Similarly, because shapes and materials for the first supporting member 30 and the second supporting member 50 are the same as in the first embodiment, descriptions thereof will be omitted.

As shown in FIG. 4, the heater 100 according to the second embodiment includes the heating member 10 with the substrate-heating surface 10a, the auxiliary member 20, the ejection port 14h, the first supporting member 30, and the second supporting member 50. The first supporting member 30 and the second supporting member 50 are fixed to the base 40.

The auxiliary member 20 has an outer circumferential wall 22 which protrudes from the outer circumferential portion of the opposing surface 20a in a direction substantially perpendicular to the opposing surface 20a. The heating member 10 has a groove 17 with a width wider than a thickness 22w of the outer circumferential wall 22. The outer circumferential wall 22 and the groove 17 will be described later with reference to FIG. 7.

The heating member 10 has the resistance heating elements 11 therein, the substrate-heating surface 10a, and the heating member rear surface 10b. A plurality of communicating holes 14c are formed at the heating member 10. The heating member 10 also has a mounted surface 10d. The heating member rear surface 10b is provided with the groove 17 with a width 17w. The mounted surface 10d is lower than the substrate-heating surface 10a of the heating member 10.

The auxiliary member 20 has an opposing wall 21 which protrudes from the outer circumferential portion of the opposing surface 20a in a direction substantially perpendicular to the opposing surface 20a. The opposing surface 20a opposes the heating member rear surface 10b of the heating member 10.

The gas path 14 is formed by the planar gas path 14a and a communicating hole 14c which is in communication with the planar gas path 14a.

The planar gas path 14a is formed by the heating member rear surface 10b of the heating member 10 and the opposing surface 20a of the auxiliary member 20.

The communicating hole 14c ejects gas from the ejection port 14h. The communicating hole 14c communicates from the substrate-heating surface 10a to the planar gas path 14a. A plurality of the communicating holes 14c are preferably formed at the outer circumferential portion of the substrate-heating surface 10a at regular intervals therebetween. The communicating hole 14c is preferably formed in a shape extending in a direction substantially perpendicular to the substrate-heating surface 10a.

Figure 5:
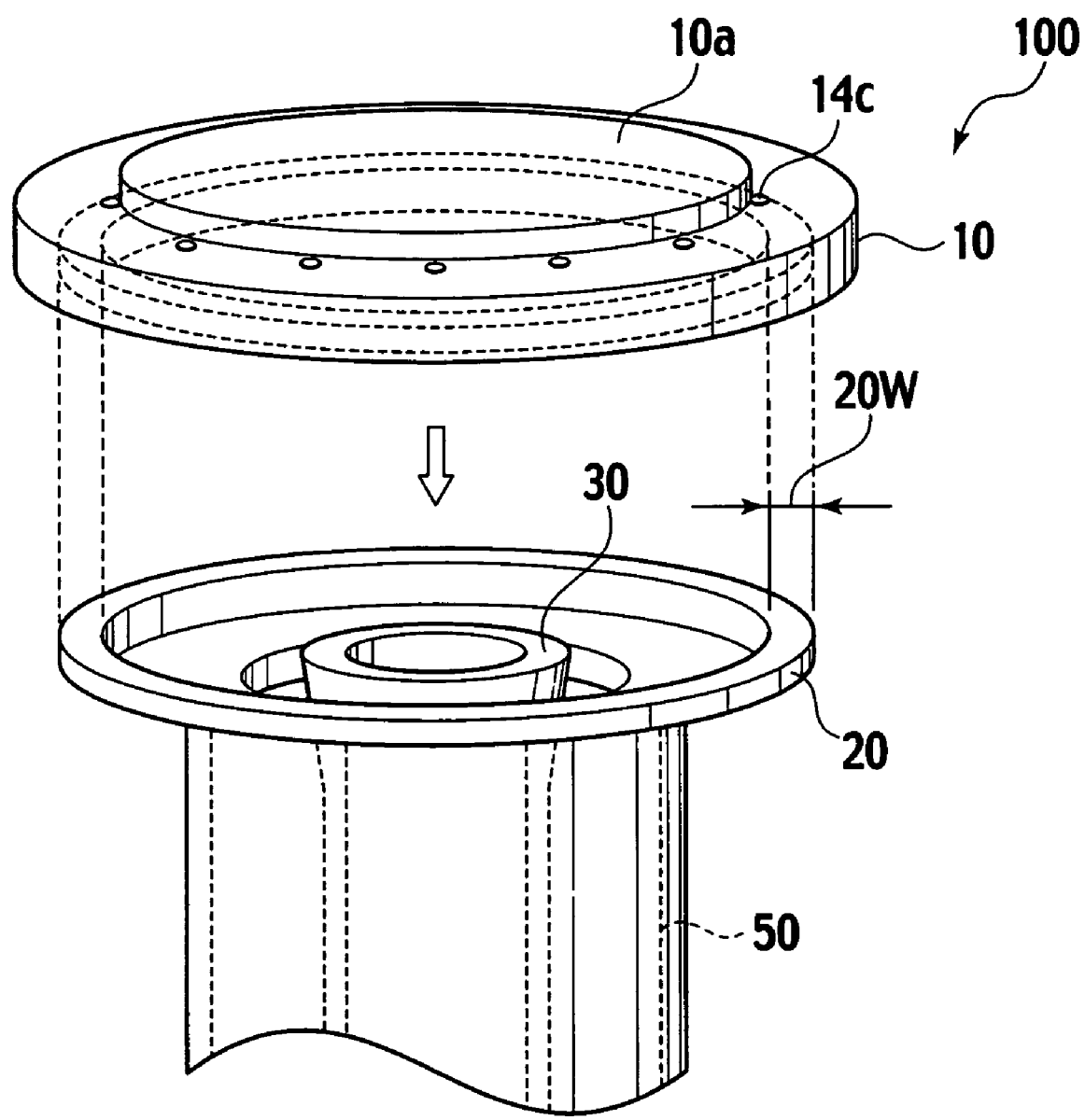
FIG. 5 is an exploded view of the heater according to the second embodiment.

FIG. 5 shows a part of the exploded view of FIG. 4. As shown in FIG. 5, the heating member 10 is supported by the first supporting member 30. The auxiliary member 20 is provided with a hole through which the first supporting member 30 passes and supported by the second supporting member 50.

Figure 6:
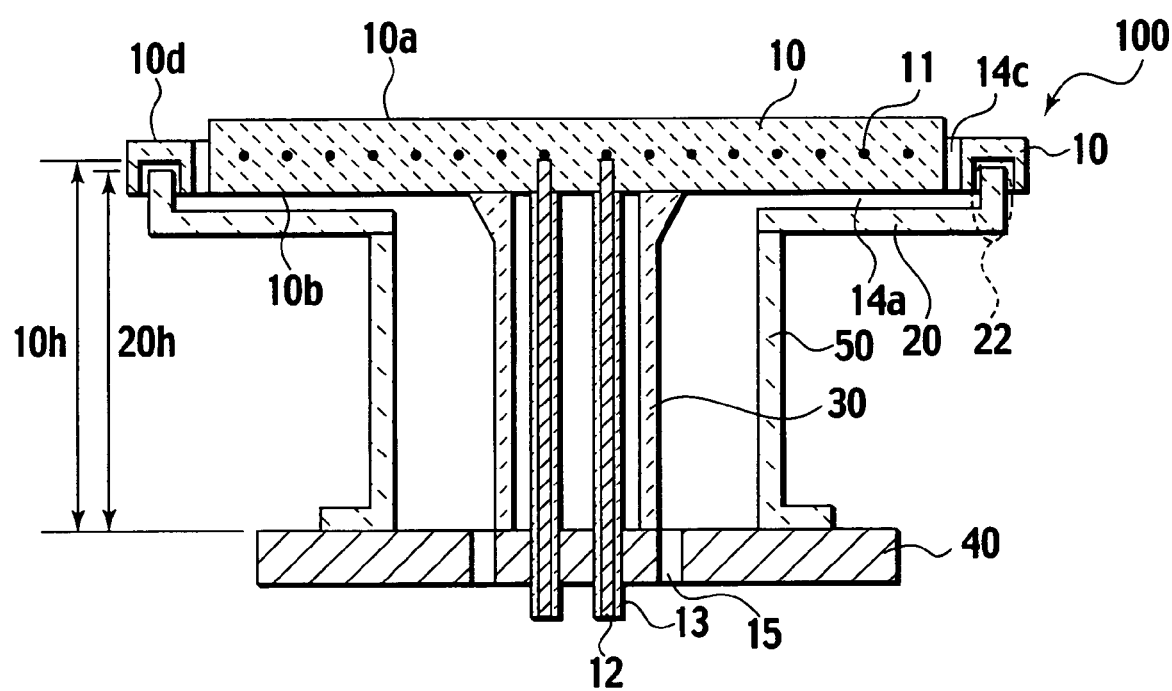
FIG. 6 is a cross-sectional view of the heater of the second embodiment, taken along a line 4a-4a in FIG. 4.

FIG. 6 is a cross-sectional view taken along a line 4a-4a in FIG. 4.

A clearance which communicates from a portion that the planar gas path 14a meets the communicating hole 14c to the outside of the heater 100 and which is configured so as to control a gas flow is preferably formed between the heating member rear surface 10b of the heating member 10 and the opposing surface 20a of the auxiliary member 20. The configuration for controlling the gas flow means a configuration whose cross-sectional area is significantly smaller than that of the planar gas path 14a or a crank configuration. Specific examples include the crank configuration that is formed by the groove 17 formed at the heating member rear surface 10b of the heating member 10 and the outer circumferential wall 22 formed at the opposing surface 20a of the auxiliary member 20.

The crank configuration formed by the groove 17 and the outer circumferential wall 22 will be further described with reference to FIG. 7.

Figure 7:
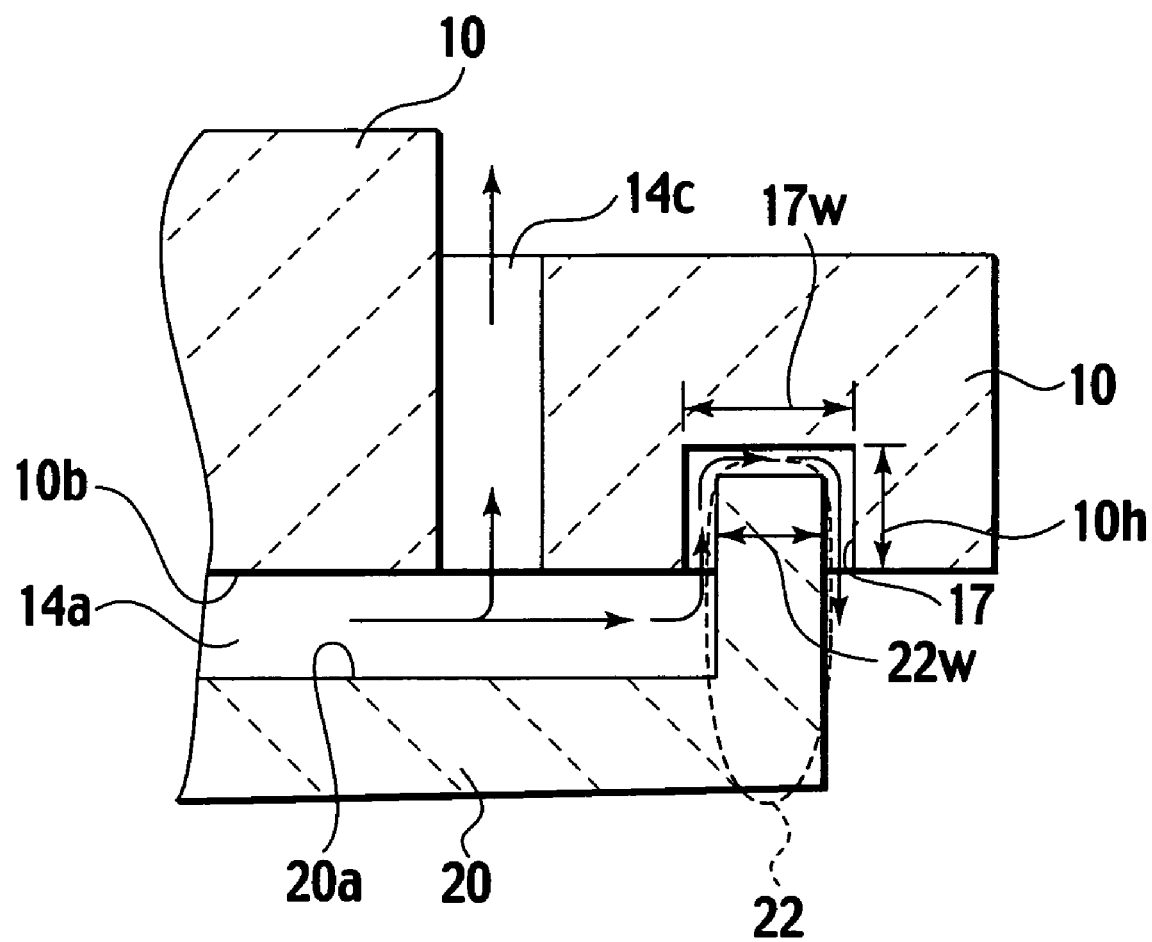
FIG. 7 is a cross-sectional view of the heater of the second embodiment.

FIG. 7 is an expanded view of the groove 17 formed at the heating member rear surface 10b of the heating member 10 and the outer circumferential wall 22 formed at the opposing surface 20a of the auxiliary member 20.

As shown in FIG. 7, by the groove 17 and the outer circumferential wall 22, a clearance formed between the heating member rear surface 10b of the heating member 10 and the opposing surface 20a of the auxiliary member 20 communicates from the portion that the planar gas path 14a meets the communicating hole 14c to the outside of the heater 100. That is, the heating member rear surface 10b does not contact the opposing surface 20a of the auxiliary member 20.

According to the heater 100 of the second embodiment, the heating member 10 has a plurality of the communicating holes 14c that communicate from the substrate-heating surface 10a to the planar gas path 14a. In a process for manufacturing the heater 100, the heating member 10 is easily positioned with respect to the auxiliary member 20. Since the communicating holes 14c are formed along the outer circumferential portion of the substrate-heating surface 10a at regular intervals therebetween, accumulation of the reactive film on the substrate-heating surface 10a is suppressed effectively.

Since the communicating holes 14c are formed in a substantially perpendicular to the substrate-heating surface 10a, gas ejects in a substantially perpendicular to the substrate-heating surface 10a. Accordingly, accumulation of the reactive film is further reduced.

The heating member 10 is supported by the first supporting member 30. The auxiliary member 20 is provided with a hole through which the first supporting member 30 passes and supported by the second supporting member 50. The clearance formed between the heating member rear surface 10b of the heating member 10 and the opposing surface 20a of the auxiliary member 20 communicates from the portion that the planar gas path 14a meets the communicating hole 14c to the outside of the heater 100. The heating member rear surface 10b does not contact the opposing surface 20a of the auxiliary member 20. Therefore, the clearance formed between the heating member rear surface 10b and the opposing surface 20a of the auxiliary member 20 absorbs dimensional errors in the first supporting member 30 and the second supporting member 50.

Since the clearance formed between the heating member rear surface 10b of the heating member 10 and the opposing surface 20a of the auxiliary member 20 is configured so as to control a gas flow, leakage of gas ejected toward the substrate-heating surface 10a from the clearance is suppressed.

THIRD EMBODIMENT

Heater

A heater 100 according to a third embodiment of the present invention will be described below with reference to the drawings. The differences between the first embodiment and the third embodiment will be mainly described.

Specifically, in the first embodiment, the heating member 10 is supported by the first supporting member 30, while the auxiliary member 20 is supported by the second supporting member 50. Namely, the heating member 10 and the auxiliary member 20 are supported separately. In contrast, according to the third embodiment, the auxiliary member 20 is directly fixed to the heating member 10 which is supported by the first supporting member 30.

Figure 8:
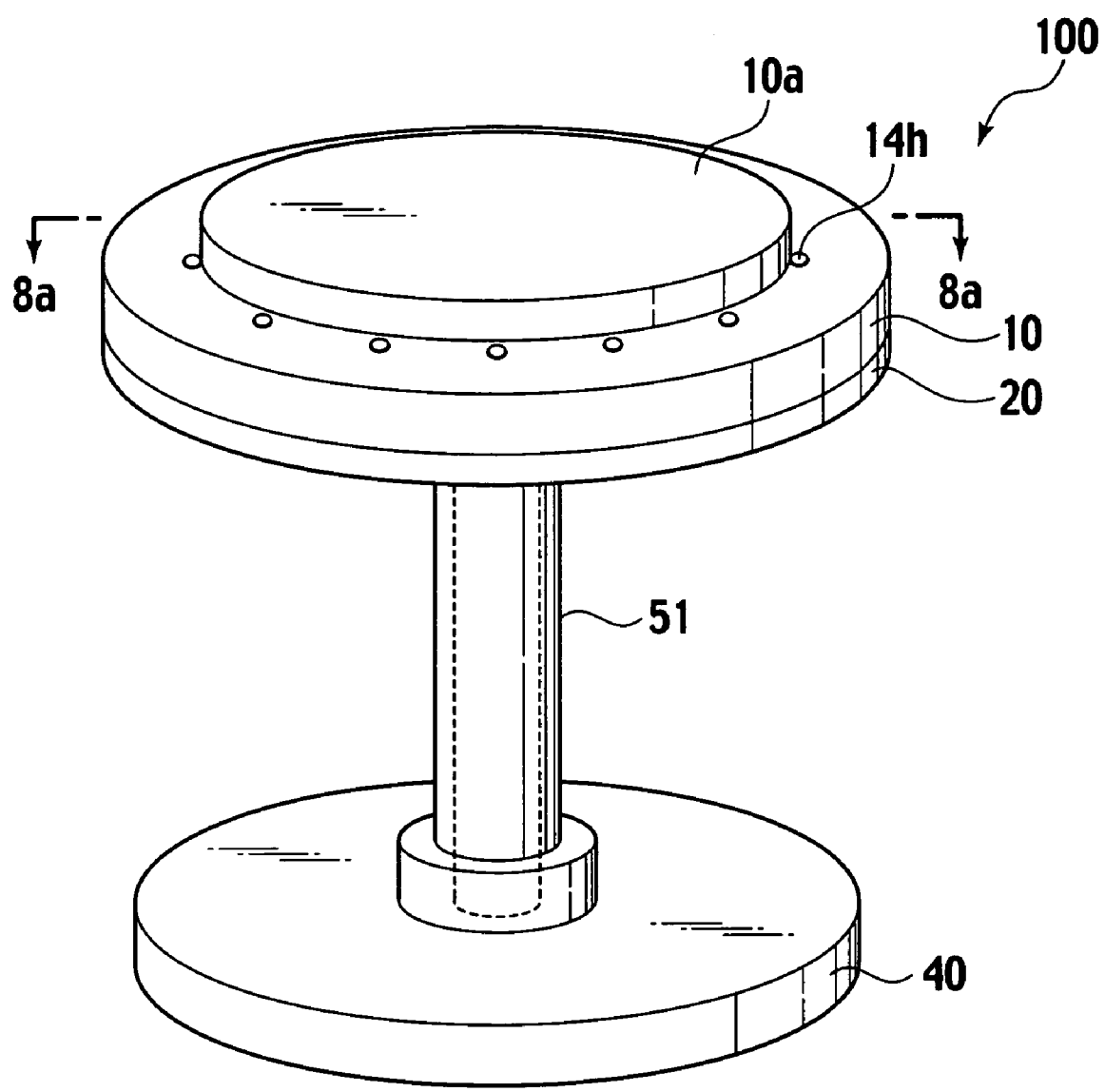
FIG. 8 is a perspective view of a heater according to a third embodiment of the present invention.

FIG. 8 is a perspective view of the entire heater 100 according to the third embodiment. As shown in FIG. 8, according to the heater 100 of the third embodiment, the auxiliary member 20 is fixed to the heating member 10. The heater 100 of the third embodiment includes the heating member 10 that has the substrate-heating surface 10a as in the second embodiment, the auxiliary member 20, the gas path 14, and the second supporting member 50.

Figure 9:
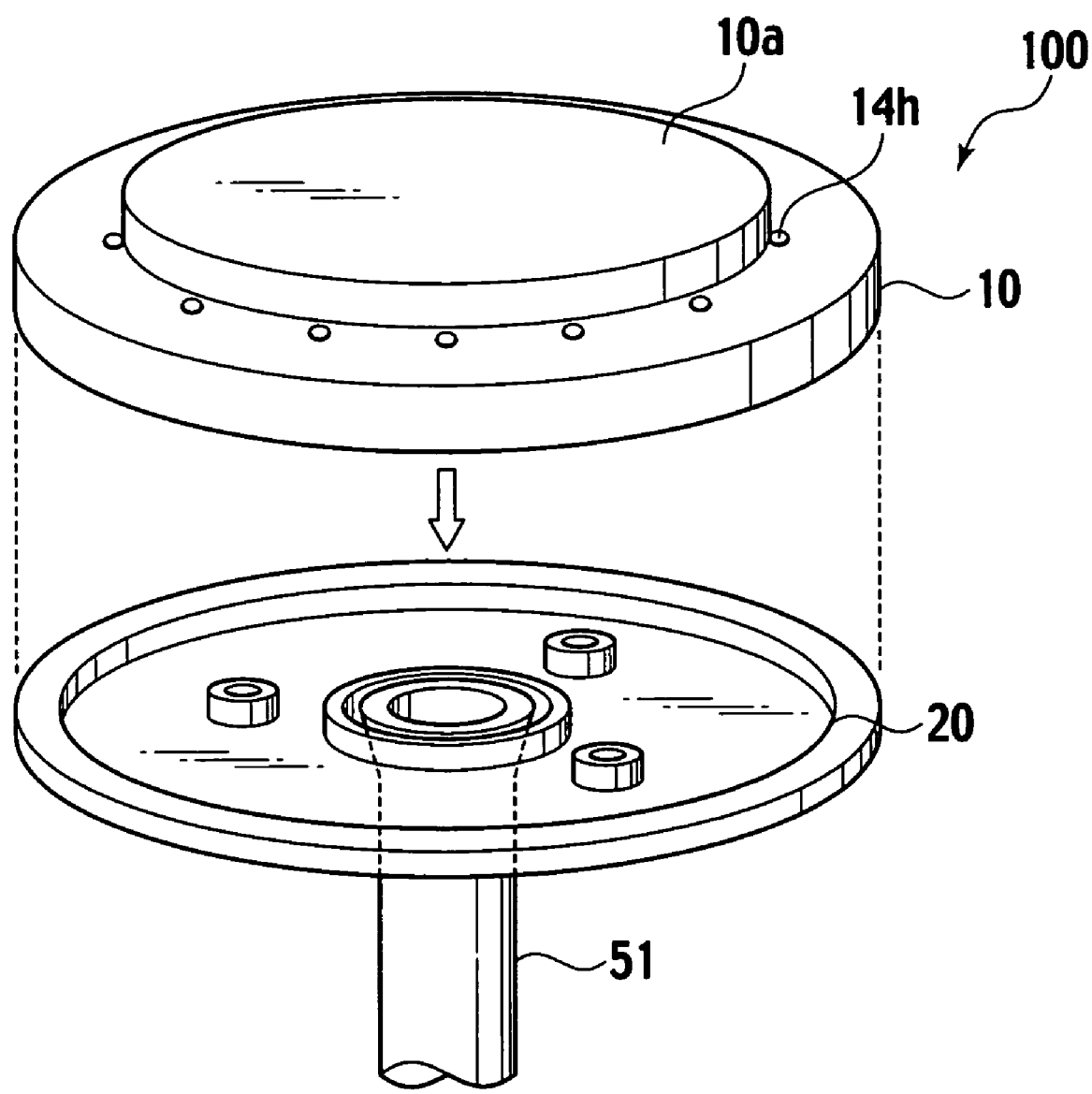
FIG. 9 is an exploded view of the heater according to the third embodiment.

FIG. 9 shows a part of the exploded view of FIG. 8. As shown in FIG. 9, the heating member 10 is supported by a first supporting member 51. The auxiliary member 20 is provided with a hole through which the first supporting member 51 passes.

Figure 10:
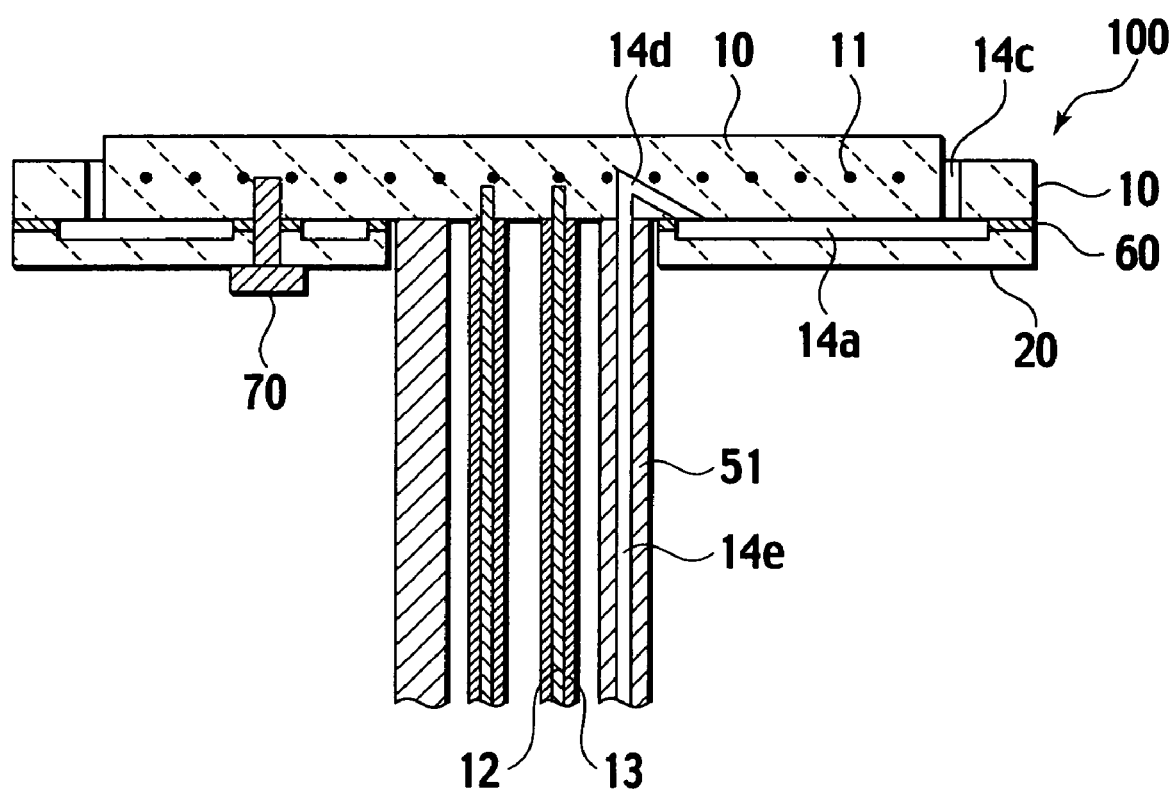
FIG. 10 is a cross-sectional view of the heater of the third embodiment, taken along a line 8a-8a in FIG. 8.

FIG. 10 is a cross-sectional view taken along a line 8a-8a in FIG. 8.

The heating member 10 includes, as in the second embodiment, the resistance heating elements 11 therein, the substrate-heating surface 10a, and the heating member rear surface 10b. The heating member 10 is also provided with a plurality of communicating holes 14c and the gas path 14d, and includes the mounted surface 10d.

The auxiliary member 20 has the opposing surface 20a, an outer circumferential wall, and an inner circumferential wall. The auxiliary member 20 is preferably fixed to the heating member 10. In the third embodiment, the auxiliary member 20 is fixed to the heating member 10 by a screw 70. The auxiliary member 20 is preferably made of the same ceramics or the same composite materials of ceramics and metals as those of the heating member 10. The opposing surface 20a opposes the heating member rear surface 10b of the heating member 10.

The outer circumferential wall is outside the communication hole 14C formed at the heating member 10, and protrudes in a direction substantially perpendicular to the opposing surface 20a at the outer circumferential portion thereof.

The inner circumferential wall protrudes, inside the communicating hole 14c, in a direction substantially perpendicular to the opposing surface 20a. Preferably, the height of the outer circumferential wall is substantially equal to that of the inner circumferential wall. While the outer circumferential wall closely contacts the heating member rear surface 10b and the inner circumferential wall closely contacts the heating member rear surface 10b, O-rings 60 can be placed at the close contact surfaces for joining them.

The gas path 14 is formed by the planar gas path 14a, the communicating hole 14c which is in communication with the planar gas path 14a, and the gas path 14d which is in communication with the planar gas path 14a.

The planar gas path 14a is formed by the heating member rear surface 10b of the heating member 10, the opposing surface 20a of the auxiliary member 20, the outer circumferential wall, and the inner circumferential wall.

The gas path 14d is formed within the heating member 10 and is in communication with the planar gas path 14a.

The first supporting member 51 supports the heating member 10. The first supporting member 51 is a hollow cylinder and houses the feeding member 12 therein. A gas path 14e is formed within the first supporting member 51. The first supporting member 51 is joined to the heating member rear surface 10b of the heating member 10. Since materials for the first supporting member 51 and its joining method are the same as in the case of the first supporting member 30 of the first embodiment, descriptions thereof will be omitted.

The gas path 14e is in communication with the gas path 14d.

Since the resistance-heating element 11, the feeding member 12, the insulating member 13, and the base 40 are the same as in the first embodiment, descriptions thereof will be omitted.

According to the heater 100, the auxiliary member 20 is fixed to the heating member 10, and the height of the outer circumferential wall is substantially equal to that of the inner circumferential wall. The dimensional accuracy of the planar gas path 14a formed between the heating member rear surface 10b of the heating member 10 and the opposing surface 20a of the auxiliary member 20 is thus improved. Gas leakage from the planar gas path 14a is suppressed.

Because members for supporting the auxiliary member 20 are not required, the device is lightened and easily handled. Further, since the diameter of the base is reduced, a part to which the device is mounted via the base is designed to be compact.

OTHER EMBODIMENTS

Heater

While the present invention has been described with reference to the foregoing embodiments, it should not be understood that the present invention is limited by the foregoing descriptions and the drawings which are a part of the disclosure of the present invention. From the above disclosure, various alternative embodiments, examples, and technologies using the prevent invention will be apparent to those skilled in the art.

Figure 11:
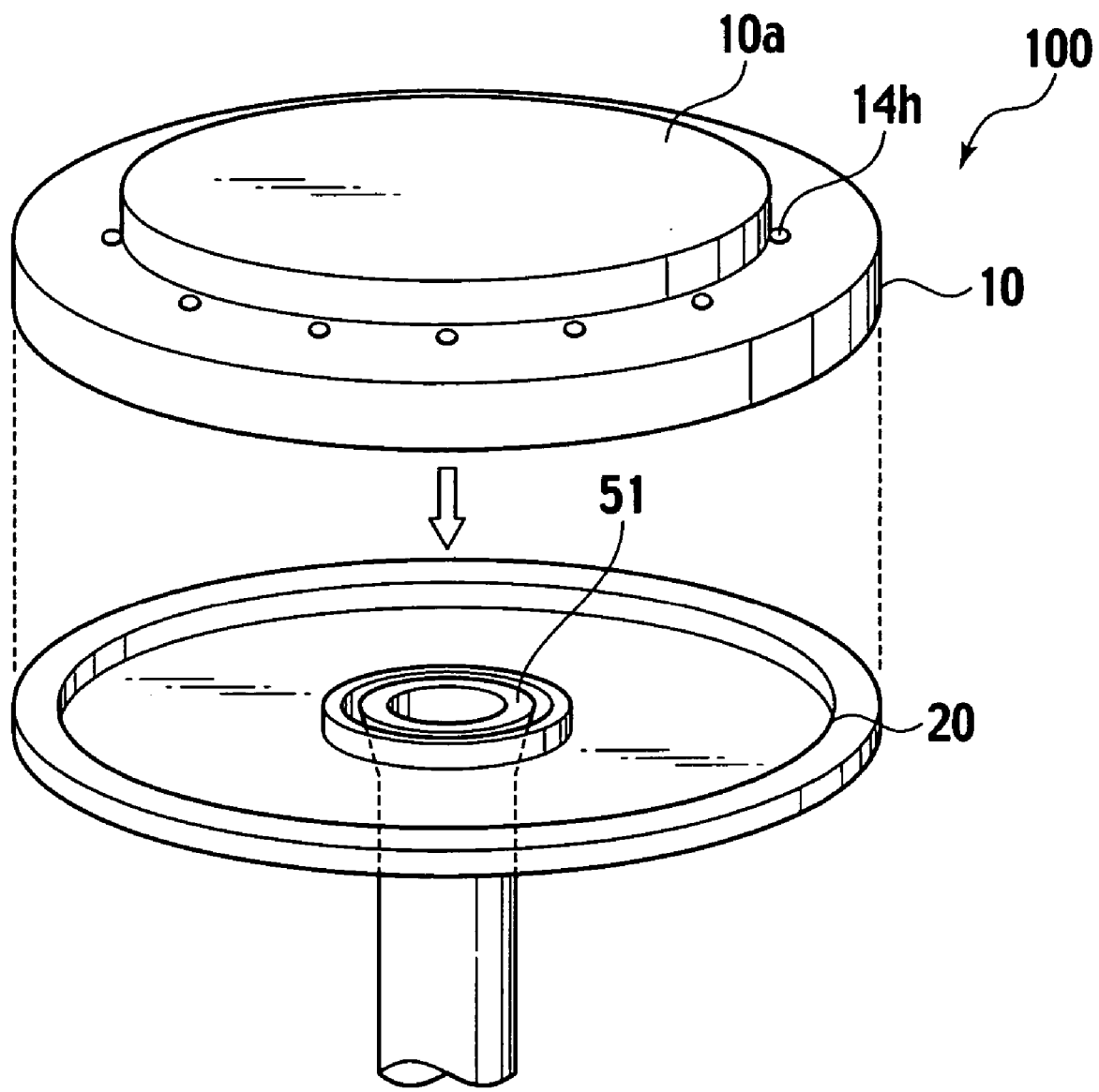
FIG. 11 is a perspective view of a heater according to the present invention.

While the auxiliary member 20 is fixed to the heating member 10 by screwing in the third embodiment, as shown in FIG. 11, the auxiliary member 20 can be fixed to the heating member 10 by brazing.

While the crank configuration for controlling a gas flow shown in FIG. 7 is described in the second embodiment, the clearance formed between the heating member rear surface 10b and the opposing surface 20a of the auxiliary member 20 only absorbs the dimensional errors in the first supporting member 30 and the second supporting member 50. For example, the configuration whose cross-sectional area is significantly smaller than that of the planar gas path 14a is preferable. Alternatively, a ring-shaped member made of ceramics can be formed outside the planar gas path 14a between the heating member rear surface 10b and the opposing surface 20a of the auxiliary member 20.

EXAMPLES

While the present invention will be described in further detail by examples, the invention is not limited to any of the following examples.

The heating member 10 was prepared first as follows. A binder and yttrium oxide serving as a sintering aid were added to aluminum nitride powder serving as ceramics raw material powder for the heating member 10 and they were mixed together using a ball mill. The resulting slurry was granulated by spray granulation so as to be made into granule. The resulting granule was molded in a plate by metallic molding. At the same time, the granule was molded in a tube for the first supporting member 30 by isostatic pressing. The resulting tube-shaped molded body was sintered by pressureless sintering under a nitrogen gas atmosphere at 1800° C. for about 2 hours.

The resistance heating elements 11 made of molybdenum in a coil shape in advance were placed on the plate-shaped molded body. The granule was loaded on the resistance heating elements 11 and the molded body, and the press molding was performed.

The aluminum nitride molded body with the resistance heating elements 11 integrally molded therewith was set in a case made of carbon and sintered by the hot pressing. Specifically, the molded body was integrally sintered under a nitrogen pressurized atmosphere at 1800° C. for 2 hours while being pressurized at 200 kgf/cm$^2$.

For the resulting heating member 10, the process of flattening the substrate-heating surface 10a and the process of drilling a hole for the feeding member 12 were performed. A part of the resistance-heating element 11 was exposed in advance. The heating member 10 had a diameter of 237 millimeters and a thickness of 18 millimeters. The first supporting member 30 had an outer diameter of 55 millimeters, an inner diameter of 45 millimeters, and a length of 169 millimeters.

A cementing material was applied to the joined surfaces of the heating member 10 and the first supporting member 30, and they were adhered to each other. The heating member 10 and the first supporting member 30 were joined together by thermally processed under a nitrogen atmosphere at 1700° C. for 2 hours. The feeding member 12 was joined to the resistance-heating element 11 by brazing. An end portion of the first supporting member 30 was processed in a flange shape.

As shown in FIG. 6, the communicating hole 14c with a diameter of 3 millimeters was formed at the substrate-heating surface 10a by drilling. Twelve communicating holes 14c with a diameter of 3 millimeters were provided on the substrate-heating surface 10a along an outer circumference of a substrate at regular intervals therebetween.

The auxiliary member 20 was prepared as follows. A binder and yttrium oxide serving as a sintering aid were added to aluminum nitride powder serving as ceramics raw material powder for the auxiliary member 20 and they were mixed together by a ball mill. The resulting slurry was granulated by the spray granulation so as to be formed into granule. The resulting granule was molded in a plate by the metallic molding. At the same time, the granule was molded in a tube for the second supporting member 50 by the isostatic pressing. The resulting plate-shaped molded body was sintered by the hot pressing under a nitrogen gas atmosphere at 1800° C. for about 2 hours. The tube-shaped molded body was sintered by the pressureless sintering under a nitrogen gas at 1800° C. for about 2 hours.

A drilling process of making a hole for a lift pin was performed for the resulting auxiliary member 20. The auxiliary member 20 had a diameter of 228 millimeters and a thickness of 5 millimeters. The second supporting member 50 had an outer diameter of 98 millimeters, an inner diameter of 88 millimeters, and a length of 161 millimeters.

A cementing material was applied to the joined surfaces of the auxiliary member 20 and the second supporting member 50, and they were adhered to each other. The heating member 20 and the first supporting member 50 were joined together by subjected to a thermal process under a nitrogen atmosphere at 1700° C. for 2 hours. An end portion of the second supporting member 50 was processed in a flange shape.

The first supporting member 30 and the second supporting member 50 were fixed to the base 40 made of aluminum by screws. The flange portions of the first supporting member 30 and the second supporting member 50 were formed in a seal configuration with respect to the base by utilizing O-rings. The base 40 was provided with the gas introduction hole 15 which communicates the space between the first supporting member 30 and the second supporting member 50 by drilling.

As described above, the heater 100 that had the planar gas path 14a and the communicating hole 14c which was in communication with the planar gas path 14a as the gas path 14 was obtained. Gas was flown from the gas introduction hole 15 through the space between the first supporting member 30 and the second supporting member 50 and the planar gas path 14a to the communicating hole 14c.

For a sample 3 which was a comparative example, after the heating member low as sintered, it was subjected to a drilling process from its side surface, so that a gas path which was parallel to the heating surface was formed. Since the length of the gas hole to be processed was so long, however, the side wall of the hole was lacked during a cutting process and thus the diameter of the hole was not uniform, resulting in dimensional variations in the gas path.

(Evaluation Method)

Samples 1 and 2 were evaluated by using the resulting heater 100.

A silicon wafer was mounted on the heater 100 and heated to 420° C. A high purity tungsten hexafluoride gas was applied to the upper surface of the silicon wafer. Accordingly, a tungsten film was formed on the silicon wafer by a CVD device.

For the sample 1, a nitrogen gas was introduced from the gas introduction hole 15 and ejected from the communicating hole 14c of the substrate-heating surface 10a, so that a tungsten film was formed by the CVD device.

For the sample 2, a tungsten film was formed by the CVD device without introducing gas.

(Evaluation Results)

In the sample 1, the tungsten film was not formed at the outer circumferential portion of the silicon substrate. The tungsten film neither formed at the boundary between the substrate-heating surface 10a and the silicon substrate.

In the sample 2, the tungsten film was formed at the outer circumferential portion of the silicon substrate. The tungsten film was also formed at the boundary between the substrate-heating surface 10a and the silicon substrate.

This is because in the sample 1, the nitrogen gas was ejected from the communicating hole 14c of the substrate-heating surface 10a and served as a barrier gas so that the tungsten film caused by the high purity tungsten hexafluoride gas was not formed at the outer circumferential portion of the silicon substrate.

According to the sample 1, the silicon substrate was easily separated from the substrate-heating surface 10a. According to the sample 2, when the silicon substrate was separated from the substrate-heating surface 10a, the tungsten film was hardly peeled from the substrate-heating surface 10a. By a stress generated between the tungsten film and the substrate-heating surface 10a, the tungsten film was cracked. Further, beginning at the cracks, the tungsten film on the silicon substrate was also cracked.

Accordingly, the present invention can provide a heater that can reduce variations in an amount of gas ejected on a substrate-heating surface and suppress accumulation of a reactive film on the substrate-heating surface without affecting generation of a growing film on a substrate.

What is claimed is:

1. A heater comprising:

a heating member formed in a plate shape that includes a substrate-heating surface on which a substrate is mounted and a heating member rear surface which is on a side of the heating member opposing the substrate-heating surface, the heating member having a resistance heating element embedded therein; and an auxiliary member provided on the rear surface side of the heating member and having an opposing surface which opposes the heating member rear surface;

wherein the opposing surface of the auxiliary member extends outwardly beyond the heating member rear surface;

wherein an opposing wall is provided on the opposing surface of the auxiliary member, the opposing wall being disposed in continuity along a side surface of the heating member and protruding in a direction substantially perpendicular to the opposing surface of the auxiliary member;

wherein a planar gas path for gas ejected on the substrate-heating surface is formed between the heating member rear surface and the opposing surface of the auxiliary member; and wherein a gas ejection path communicating from the planar gas path toward the substrate-heating surface is formed between the side surface of the heating member and the opposing wall of the auxiliary member.

2. The heater according to claim 1, further comprising:
a first supporting member that supports the heating member from the heating member rear surface; and
a second supporting member that supports the auxiliary member from an auxiliary member rear surface which is a surface of the auxiliary member on the opposite side of the opposing surface.

3. The heater according to claim 1, wherein
the opposing wall comprises a surface that is lower than the substrate-heating surface.

4. A heater comprising:
a heating member formed in a plate shape that includes a substrate-heating surface on which a substrate is mounted and a heating member rear surface which is on a side of the heating member opposing the substrate-heating surface, the heating member having a resistance heating element embedded therein; and
an auxiliary member provided on the rear surface side of the heating member and having an opposing surface which opposes the heating member rear surface;
wherein a planar gas path for gas ejected on the substrate-heating surface is formed between the heating member rear surface and the opposing surface of the auxiliary member; and
wherein the heating member comprises a plurality of communicating holes that communicate between the substrate-heating surface and the planar gas path, the plurality of communicating holes being formed along an outer circumferential portion of the substrate-heating surface at regular intervals therebetween.

5. The heater according to claim 4, comprising:
a first supporting member that supports the heating member from the heating member rear surface; and
a second supporting member that supports the auxiliary member from an auxiliary member rear surface which is a surface of the auxiliary member on the opposite side of the opposing surface;
wherein
a clearance, which communicates between a portion of the planar gas path that meets the communicating hole and an outside of the heater, is formed between the heating member rear surface and the opposing surface of the auxiliary member, the clearance being configured so as to control a gas flow.

6. The heater according to claim 4, comprising a first supporting member which supports the heating member from the heating member rear surface, wherein
an outer circumferential wall, which is disposed in continuity outside the communicating holes, and an inner circumferential wall, which is disposed in continuity inside the communicating holes, are provided on the opposing surface;
wherein the length of the outer circumferential wall is substantially equal to that of the inner circumferential wall in a direction substantially perpendicular to the opposing surface; and
wherein the auxiliary member is fixed to the heating member.

7. The heater according to claim 6, wherein the auxiliary member is fixed to the heating member by brazing or screwing.

8. The heater according to claim 4, wherein the communicating holes extend in a direction substantially perpendicular to the substrate-heating surface.

9. The heater according to claim 4, wherein the heating member comprises a surface which is lower than the substrate-heating surface on the outside thereof.

* * * * *